United States Patent [19]
Berndes et al.

[11] Patent Number: 4,672,415
[45] Date of Patent: Jun. 9, 1987

[54] POWER THYRISTOR ON A SUBSTRATE

[75] Inventors: Günter Berndes, Heppenheim; Arno Neidig, Plankstadt, both of Fed. Rep. of Germany; Eckhard Mayer, Wettingen, Switzerland

[73] Assignee: Brown, Boveri & Cie Aktiengesellschaft, Mannheim, Fed. Rep. of Germany

[21] Appl. No.: 646,907

[22] Filed: Aug. 31, 1984

[30] Foreign Application Priority Data

Aug. 31, 1983 [DE] Fed. Rep. of Germany ....... 3331298

[51] Int. Cl.⁴ ............................................ H01L 29/74
[52] U.S. Cl. ........................................ 357/38; 357/55; 357/75
[58] Field of Search .................... 357/38, 80, 75, 55

[56] References Cited

U.S. PATENT DOCUMENTS 4,156,250  5/1979  Trap ................................. 357/38 X
4,388,633  6/1983  Vasudev .......................... 357/38 X Primary Examiner—Martin H. Edlow
Attorney, Agent, or Firm—Herbert L. Lerner; Laurence A. Greenberg

[57] ABSTRACT

A power thyristor assembly, includes an insulating and metallized substrate, and a power thyristor having a cathode and gate side facing toward and soldered to the substrate, and an anode side facing away from the substrate, the anode side having an anode and a passivation ditch surrounding the anode, the anode side including a reverse junction, the cathode and gate side including a blocking pn-junction, and the passivation ditch being common to the anode side reverse junction and to the cathode and gate side blocking pn-junction.

3 Claims, 11 Drawing Figures

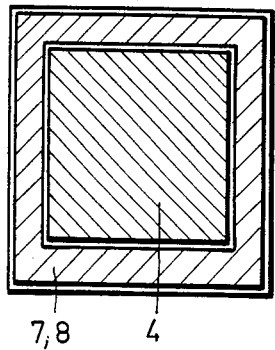
Fig.8
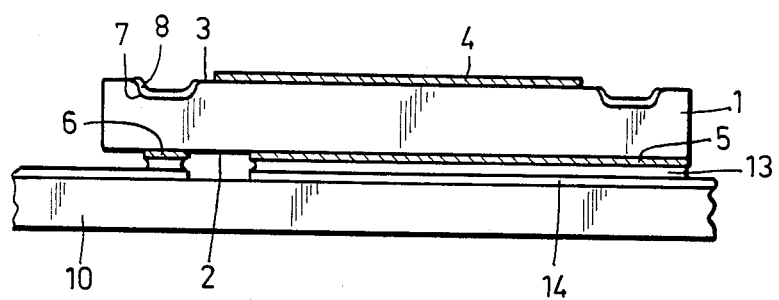
Fig.9
Fig.10  Fig.11
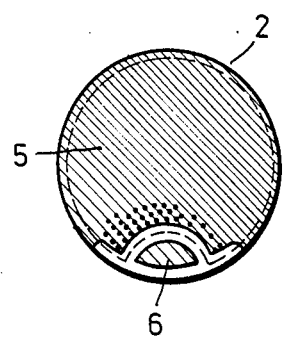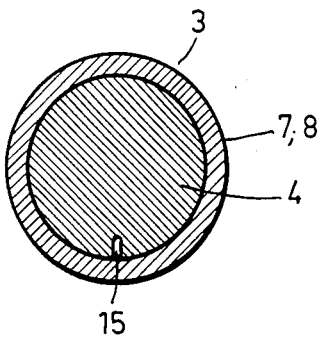

POWER THYRISTOR ON A SUBSTRATE

The invention relates to a power thyristor which is soldered onto an insulating metallized substrate.

Devices having one or more active semiconductor components on a substrate, possibly in conjunction with passive components, are known as hybrid circuits, which may be inserted into module housings.

In the previously known devices, thyristors in the form of unencapsulated chips are mounted on a substrate in such a manner that the anode side of the thyristor is at the bottom, that is to say it faces the substrate, whereas the side with the cathode and gate faces away from the substrate. The thyristor essentially makes contact with the metallized surfaces of the substrate either by pressure contact or by soldering.

In the case of a contact being made by pressure, the anode side of the thyristor is alloyed onto a round molybdenum blank in order to achieve the necessary solidity for a pressure contact. One disadvantage of the pressure-contact technique is the fact that it is less suitable for hybrid circuits in which several components of different diameter are to be disposed within one module.

If several components of different diameter are to be combined, greater flexibility and economy is achieved with hybrid structures produced according to the solder-contact technique than with the pressure-contact technique. In the case of a solder contact, increasing use is made of so-called glass-passivated thyristors or other glass-passivated active parts as a basis. The outer edge of these devices have a circumferential etched groove on both sides, into which passivating glass is fused. The anode side of power thyristors with reverse voltages of greater than about 800 V is soldered onto a small platform (having a somewhat smaller surface as compared with the anode surface) in order to prevent flashover from the passivation edge to a substrate metallization carrying an anode potential or to a contact electrode when a reverse voltage is applied. Contact bows are used for connecting the cathode and gate connections of thyristors to metallized surfaces on a substrate or to other connections. Since the distances between the gate and the cathode electrode of a thyristor chip are small (less than 1 mm), great care must be taken in placing the contact bows and in some cases special aids are required for this. In addition, a disadvantage is that faulty contacts or connections leading to an increased rejection rate can be created by inaccurate placement or by bent contact bows. Finally, the expenditure for assembly is high due to the fact that relatively large amounts of individual components must be used, namely at least one round spacing blank, two contact bows and two solder wafers or contact fuses.

It is accordingly an object of the invention to provide a power thyristor on a substrate, which overcomes the hereinafore-mentioned disadvantages of the heretofore-known devices of this general type, and which simplifies the formation and manufacturing of hybrid circuits including power semiconductor components by using the solder-contact technique. For this purpose, an embodiment of the thyristor chip is to be provided which necessitates use of a smaller number of parts to be contacted and finally leads to a reduced rejection rate during the manufacture of hybrid circuits.

With the foregoing and other objects in view there is provided, in accordance with the invention, a power thyristor assembly, comprising an insulating and metallized substrate, and a power thyristor having a cathode and gate side facing toward and soldered to the substrate, and an anode side facing away from the substrate, the anode side having an anode and a passivation ditch, trench or trough, surrounding the surface of the anode, the anode side including a reverse pn-junction, the cathode and gate side including a blocking pn-junction, and the passivation ditch being common to the anode side reverse pn-junction and to the cathode and gate side blocking pn-junction.

In accordance with another feature of the invention, the cathode and gate side is the lower side and the anode side is the upper side of the thyristor.

The advantage of this structure is that small contact bows, which are otherwise required for the gate connection, are omitted, since the gate connection is simply made by an appropriate substrate metallization. The only requirement is that a connection be made by means of contact bows from the anode side, which is now at the top. The placement of these contact bows is simple and uncritical. The proposed structure is particularly advantageous if an aluminum oxide ceramic metallized with copper is used as a substrate, since the differences in expansion between silicon and aluminum oxide ceramics are slight.

According to the proposed embodiment of the thyristor, the anode surface at the top of the thyristor is surrounded by a passivation trough, trench, or ditch, for the anode-side reverse or blocking junction and the pn-junction producing blocking at the cathode side. According to an advantageous feature of the invention, the pn-junction producing blocking at the cathode side can be "pulled up" to the anode side by means of separation by diffusion. As an alternative, this can also be achieved by thermo-migration.

In accordance with concomitant feature of the invention, there is provided a gate disposed at a part of the edge of the cathode and gate side, i.e. at the bottom of the thyristor. This makes it unnecessary for a line to be passed through underneath the cathode connection for the gate connection, which would be necessary if the gate was disposed in a central region of the cathode-side area or surface.

Other features which are considered as characteristic for the invention are set forth in the appended claims.

Although the invention is illustrated and described herein as embodied in a power thyristor on a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 8 is a bottom plan view of the anode side of the power thyristor;

FIG. 9 is a side-elevational view of a power thyristor soldered onto a substrate;

FIG. 10 is a bottom plan view of the cathode and gate side of a power thyristor according to a second embodiment; and FIG. 11 is a view similar to FIG. 10 of the anode side of the power thyristor according to the second embodiment.

Referring now to the figures of the drawings in detail and first particularly to FIGS. 1-5 thereof, there is seen a power thyristor or thyristor chip 1 according to the invention, each of the figures representing the end of individual manufacturing steps. The thyristor chip 1 shown in these figures is a part of an as yet undivided silicon wafer with a diameter of approximately 3 inches.

Figure 1:
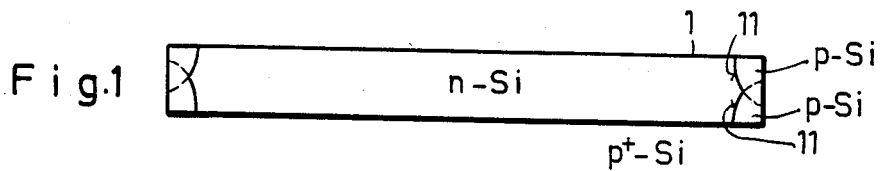
FIGS. 1-5 are diagrammatic, side-elevational views of a power thyristor according to the invention, each showing the device at the end of several successive production steps.

FIG. 1 shows a thyristor chip 1 at the end of a so-called isolating diffusion process, using n-silicon as a base material. In this process, aluminum is deeply diffused-in from both sides on the periphery of the chip 1 until diffusion fronts or faces 11, forming during this process, overlap. Aluminum is preferably used because it rapidly diffuses and can be diffused-in selectively. In general, the isolating diffusion process is carried out as the first process because it takes the longest time.

Figure 2:
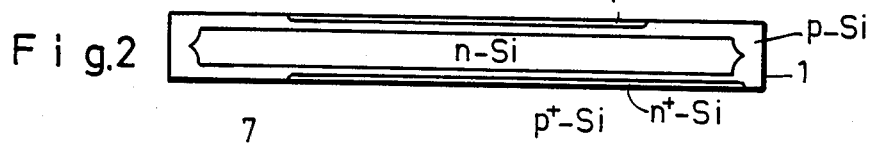

FIG. 2 shows the thyristor chip 1 after carrying out further masked standard diffusion processes which are not described in greater detail herein and which lead to a pnpn four-layer structure as shown. In this structure, emitter short circuits can be provided in the cathode region in a conventional manner.

Figure 3:
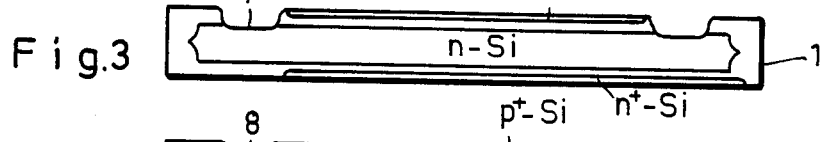

The pn-junctions are then exposed on the p+-side, that is to say the anode side at the top, in order to produce the reverse characteristics at the anode side and the blocking characteristics at the cathode side of the component. This is suitably performed by etching which produces passivation trenches, troughs, or ditches as shown in FIG. 3. The cathode and gate side blocking pn-junction can be switched from a conducting condition to a blocking condition, whereas the anode side reverse pn-junction is not controllable.

Figure 4:
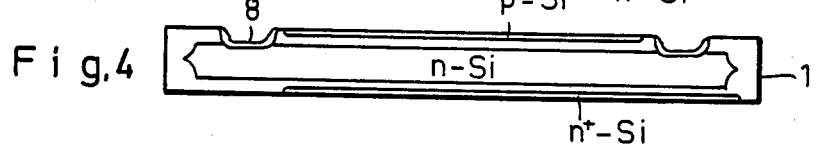

FIG. 4 shows the thyristor chip 1 after a passivation layer 8 has been applied to the trenches 7 for passivation. Passivation is carried out with a glass or by precipitating layers from the gas phase.

Figure 5:
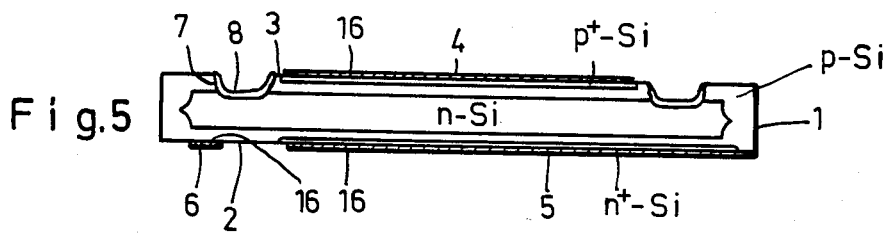

The regions of the anode 4, of the cathode 5 and of the gate 6 are then metallized, for example by physical vapor deposition of metal layers 16 as shown in FIG. 5. Dividing the wafer, preferably by sawing or alternatively by separation with a lazer beam, produces individual thyristor chips 1.

Figure 6:
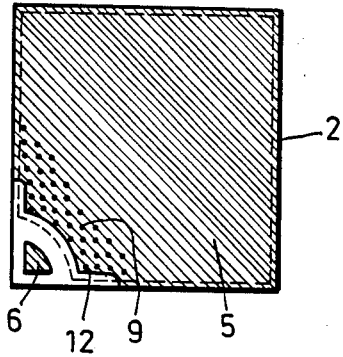
FIGS. 6 and 7 are bottom plan views of the cathode and gate side of the power thyristor according to a first embodiment, with two alternative embodiments of the gate connection.
Figure 7:
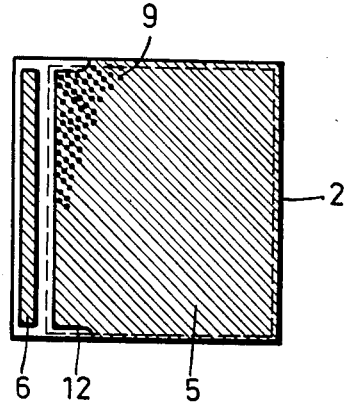

FIGS. 6 and 7 show typical alternative embodiments of the construction of the cathode and gate side 2 of the thyristor chip 1, the connection of the gate 6 being provided either on a corner or at an edge of the chip surface for simplifying the running of lines on a substrate onto which the thyristor chip 1 is to be soldered. FIGS. 6 and 7 also show an n+-region 12 with a large-area cathode 5 and emitter short circuits 9. The cathode metallization is shifted back a little at the corners in vicinity of the gate in order to prevent a low-resistance shunt between the gate and the cathode. For the same reason, the gate metallization is kept at a distance from the edge of the chip in order to prevent contact with the highlydoped isolation-diffused edge region, seen in FIGS. 5, 6, 7, 9 and 10.

FIG. 8 illustrates a typical embodiment of the anode side 3, showing the anode 4 which is surrounded by a passivation trench 7 with a passivation layer 8.

FIG. 9 shows the thyristor chip 1 soldered onto a substrate 10 with the aid of a solder layer 13. The following details can be seen in FIG. 9: the anode side 3 with the anode 4 and the passivation trench 7 coated with a passivation layer 8, and the cathode and gate-side 2 with the cathode 5 and the gate 6 facing the substrate 10. The substrate 10 is formed of an aluminum oxide ceramic which is bonded directly to a metal foil (copper foil) 14 structured in accordance with the circuit required. Temperature changes will not destroy the chip since the difference in thermal expansion between ceramic and silicon are very slight.

FIGS. 10 and 11 show a second typical embodiment of the thyristor chip 1 which is in the form of a round version instead of the square version of the first embodiment.

In this connection, FIG. 10 shows the cathode and gate side 2 with the cathode 5 and the gate 6. The anode side 3 with the anode 4 and the passivation trench 7 provided with a passivation layer 8 can be seen from FIG. 11. A marking 15 can be provided in the metallization on the anode side, as an optical assembly aid which indicates the position of the connection for the gate 6 located on the underside.

We claim:

1. Power thyristor assembly, comprising an insulating substrate, a metallization disposed on said substrate, and a power thyristor having p layers, n layers, a cathode and gate side facing toward and soldered to said substrate, and an anode facing away from said substrate, said anode side having an anode and a passivation ditch surrounding said anode, said anode side including a reverse pn-junction, said cathode and gate side including a blockage pn-junction, and said passivation ditch being common to said anode side reverse pn-junction and to said cathode and gate side blocking pn-junction.

2. Power thyristor assembly according to claim 1, wherein said cathode and gate side is the lower side and said anode side is the upper side of said thyristor.

3. Power thyristor assembly according to claim 1, including a gate disposed at a part of the edge of said cathode and gate side.

* * * * *